United States Patent [19]
Tihanyi

[11] Patent Number: 5,815,358
[45] Date of Patent: Sep. 29, 1998

[54] CIRCUIT CONFIGURATION AND SEMICONDUCTOR BODY WITH A POWER SWITCH

[75] Inventor: Jenoe Tihanyi, Kirchheim, Germany

[73] Assignee: Siemens Aktiengesellschaft, Munich, Germany

[21] Appl. No.: 710,344

[22] Filed: Sep. 16, 1996

[30] Foreign Application Priority Data

Sep. 14, 1995 [DE] Germany .................. 195 34 160.0

[51] Int. Cl.$^6$ ..................................................... H02H 5/04
[52] U.S. Cl. ........................................... 361/103; 361/101
[58] Field of Search ................................. 361/54, 56, 57, 361/58, 93, 100, 101, 103

[56] References Cited

U.S. PATENT DOCUMENTS 5,187,632 2/1993 Blessing .................................. 361/103

FOREIGN PATENT DOCUMENTS 0 208 970 1/1987 European Pat. Off. ........ H01L 25/18

*Primary Examiner*—Ronald W. Leja
*Attorney, Agent, or Firm*—Herbert L. Lerner; Laurence A. Greenberg

[57] ABSTRACT

A circuit configuration includes first and second terminals, a power switch having a control terminal, an electronic switch connected between the control terminal and the second terminal for turning off the power switch at excess temperature, a temperature sensor circuit connected between the first and second terminals and connected to the electronic switch, a switch device connected between the first terminal and the control terminal and a control device connected between the first and second terminals. The control device has an output side connected to the switch device. A semiconductor body includes an $n^-$-doped base body having upper and lower main surfaces. An $n^+$-doped layer adjoins the lower main surface of the base body. A first region has $p^+$-doped regions embedded on the upper main surface and $n^+$-doped wells contained in the $p^+$-doped regions to form a vertical power MOSFET with a drain electrode connected to the $n^+$-doped layer. A second region for at least one bipolar transistor has at least one p-doped region on the upper main surface and an $n^+$-doped well embedded in the at least one p-doped region. The at least one bipolar transistor has an emitter electrode connected to the $n^+$-doped layer in the second region, a base electrode connected to the p-doped region, and a collector electrode connected to the $n^+$-doped well.

6 Claims, 2 Drawing Sheets

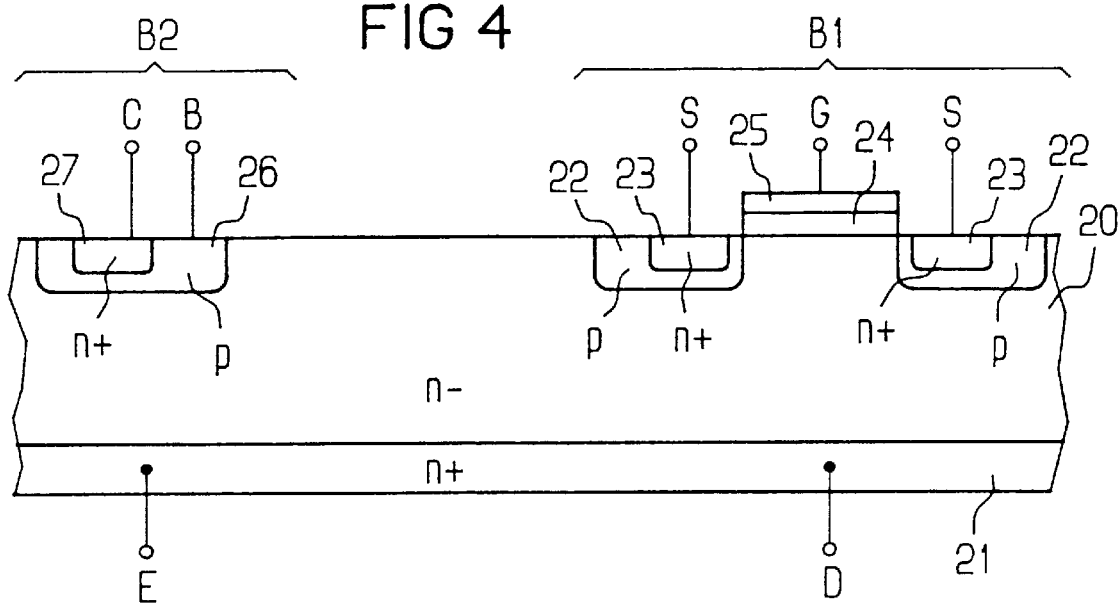
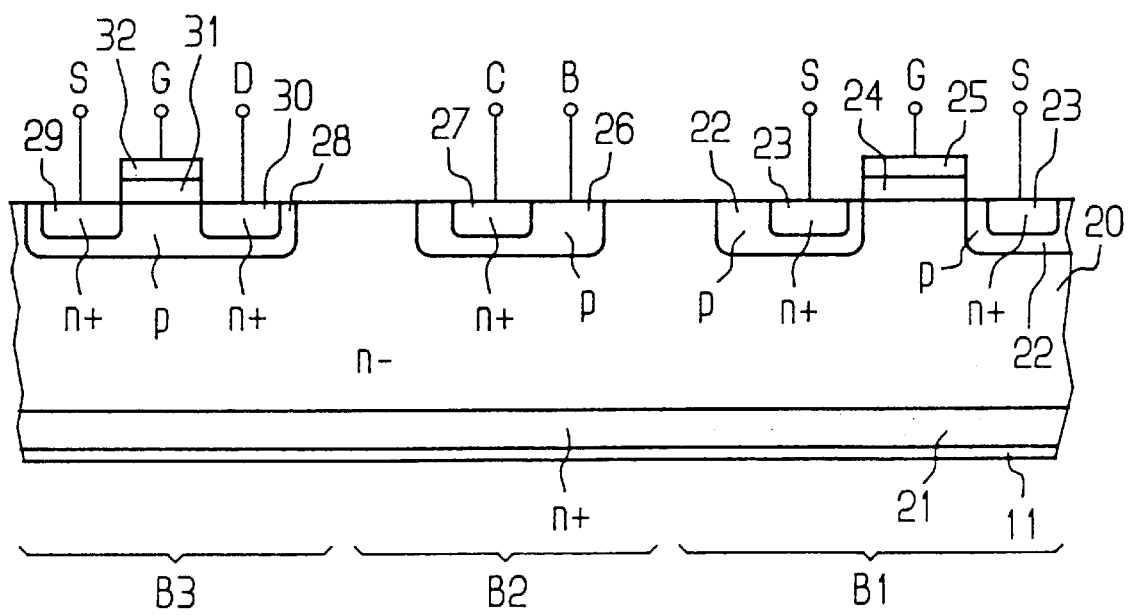

CIRCUIT CONFIGURATION AND SEMICONDUCTOR BODY WITH A POWER SWITCH

BACKGROUND OF THE INVENTION

Field of the Invention:

The invention relates to a circuit configuration with a power switch and a temperature sensor circuit located between a first terminal and a second terminal and connected to an electronic switch located between a control terminal of the power switch and the second terminal for turning off the power switch at excess temperature. The invention also relates to a semiconductor body for such a circuit configuration.

One such circuit configuration is described, for instance, in published European Patent Application 0 208 970 B1. In order to protect the power MOSFET if excess temperature occurs, a second semiconductor body, which contains a temperature sensor circuit and a semiconductor switch, is glued to a semiconductor body that contains the power MOSFET. The two semiconductor bodies are in good thermal contact with one another, so that if an excess temperature occurs within the semiconductor body of the power MOSFET it can be detected in the temperature sensor circuit. The electronic switch, for instance a thyristor, within the second semiconductor body, is connected between the source electrode and drain electrode of the power MOSFET. If the temperature in the interior of the MOSFET rises from an overload or a high ambient temperature, then the electronic switch contained in the second semiconductor body short-circuits the gate electrode to the source electrode of the MOSFET, so that the voltage previously present in the ON state between the source electrode and the gate electrode of the MOSFET collapses, and the MOSFET turns off.

A problem in that device is the use of two chips to be mounted one above the other, namely one chip containing the switching transistor, and one temperature sensor chip glued onto it. That device is relatively complicated, since double chip assembly is necessary and external wiring is needed, in order to assure adequate proof against short-circuiting of the entire configuration.

Even if the temperature sensor were integrated into the semiconductor body of the power MOSFET, reliable turnoff of the power MOSFET would not always be assured. It has in fact been found that the known temperature sensor configurations reliably turn off the power MOSFET only if there is a sufficiently great voltage drop at the temperature sensor circuit and therefore between the drain-to-source path of the power MOSFET. Although the temperature sensor circuit does turn the power MOSFET off at a chip temperature of about 150° C. to 200° C. nevertheless it does so only if the aforementioned voltage drop exceeds a certain threshold, such as 2 V. In a so-called "creeping short circuit", in which typically the drain-to-source voltage of the power MOSFET is less than the aforementioned threshold, reliable excess temperature protection of the power MOSFET is thus not possible. A "creeping short circuit" can, for instance, occur whenever circuit components located in the vicinity of the power MOSFET heat severely, or a cable insulation gradually scorches through.

SUMMARY OF THE INVENTION

It is accordingly an object of the invention to provide a circuit configuration and a semiconductor body with a power switch, which overcome the hereinafore-mentioned disadvantages of the heretofore-known devices of this general type, in such a way that reliable protection of the power switch against excess temperature is assured even at small voltage drops. It is also an object of the invention to provide a single-chip version for such a circuit configuration.

With the foregoing and other objects in view there is provided, in accordance with the invention, a circuit configuration, comprising first and second terminals; a power switch having a control terminal; an electronic switch connected between the control terminal and the second terminal for turning off the power switch at excess temperature; a temperature sensor circuit connected between the first and second terminals and connected to the electronic switch; a switch device connected between the first terminal and the control terminal; and a control device connected between the first and second terminals, the control device having an output side connected to the switch device.

With this circuit configuration, it is possible to turn off the turned-on power switch in a simple way even if the voltage present between the first and second terminals is initially not sufficient to trip the temperature sensor circuit. The circuit configuration according to the invention uses the high voltage present at the control terminal of the power switch in its ON state, and it switches this voltage to the first terminal of the circuit configuration as soon as the voltage present between the first and second terminals drops below a predetermined threshold, such as 2 V. As a result, the potential present at the first terminal is raised abruptly to approximately the potential at the control terminal of the power switch, such as 10 V, so that the temperature sensor circuit can trip and can reliably turn off the power switch.

In accordance with another feature of the invention, the switch device has a bipolar transistor, and the bipolar transistor has a load path connected between the control terminal and the first terminal and a base terminal connected to the control device.

In accordance with a further feature of the invention, there is provided a resistor having two terminals; and a further switch device having switches connected to the second terminal; the switch device having a control terminal; and the control device having first and second bipolar transistors with emitter, collector and base terminals, the emitter terminals of the first and second bipolar transistors being connected to the first terminal, resistors each being connected between the collector terminal of a respective one of the first and second bipolar transistors and one of the terminals of the further resistor, the other of the terminals of the further resistor being connected to the control terminal of the power switch, the collector terminal of the first bipolar transistor being connected to the base terminal of the second bipolar transistor, the collector terminal of the second bipolar transistor being connected to the control terminal of the switch device, and the base terminals of the first and second bipolar transistors and the control terminal of the control device each being connected through a respective one of the switches of the further switch device to the second terminal.

In accordance with an added feature of the invention, the switches of the switch device are MOSFETs having gate terminals, and the switch device includes a switch to be controlled as a function of voltage, the switch being connected between the gate terminals of the MOSFETs and the first terminal.

In accordance with an additional feature of the invention, the switch is a depletion MOSFET having a source terminal connected to the first terminal, a gate terminal connected to the second terminal, and a drain terminal connected to the gate terminals of the MOSFETs of the further switch device.

In accordance with yet another feature of the invention, the power switch is a power MOSFET having a drain terminal connected to the first terminal and a source terminal connected to the second terminal.

The circuit configuration according to the invention can be constructed in a simple way as a single-chip version, if an n-channel MOSFET is provided as the power switch and a bipolar transistor is connected between the first terminal and the control terminal of the power MOSFET in such a way that its emitter terminal is connected to the drain terminal and its collector terminal is connected to the gate terminal of the power MOSFET.

With the objects of the invention in view there is also provided a semiconductor body, comprising an $n^-$-doped middle zone or $n^-$-doped base body having upper and lower main surfaces; an $n^+$-doped layer adjoining the lower main surface of the base body; a first region having $p^+$-doped regions embedded on the upper main surface and $n^+$-doped wells contained in the $p^+$-doped regions to form a vertical power MOSFET with a drain electrode connected to the $n^+$-doped layer; and a second region for at least one bipolar transistor having at least one p-doped region on the upper main surface of the $n^-$-doped middle zone and an $n^+$-doped well embedded in the at least one p-doped region; the at least one bipolar transistor having an emitter electrode connected to the $n^+$-doped layer, a base electrode connected to the p-doped region, and a collector electrode connected to the $n^+$-doped well, in the second region.

In accordance with another feature of the invention, the $n^+$-doped layer adjoining the lower main surface of the base body has a continuous metal layer also forming the collector electrode and the drain electrode.

In accordance with a concomitant feature of the invention, there is provided a third region having at least one lateral MOSFET and being integrated with the base body.

Since the gate-to-drain path of a power MOSFET can be short-circuited by a bipolar transistor, and the emitter terminal of the bipolar transistor is connected to the same $n^+$-doped layer as the drain electrode of the power MOSFET, according to a preferred embodiment of the invention, the two can easily be integrated into a semiconductor body. The metallizing applied to the $n^+$-doped layer provides the electrical connection, which is required anyway, of the emitter electrode of the bipolar transistor to the drain electrode of the power MOSFET.

Other features which are considered as characteristic for the invention are set forth in the appended claims.

Although the invention is illustrated and described herein as embodied in a circuit configuration and a semiconductor body with a power switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a fragmentary, diagrammatic, sectional view through a semiconductor body with a power MOSFET and a bipolar transistor; and FIG. 5 is a view similar to FIG. 4 of a semiconductor body with an additional region for a lateral MOSFET.

DESCRIPTION OF THE PREFERRED EMBODIMENTS

Figure 1:
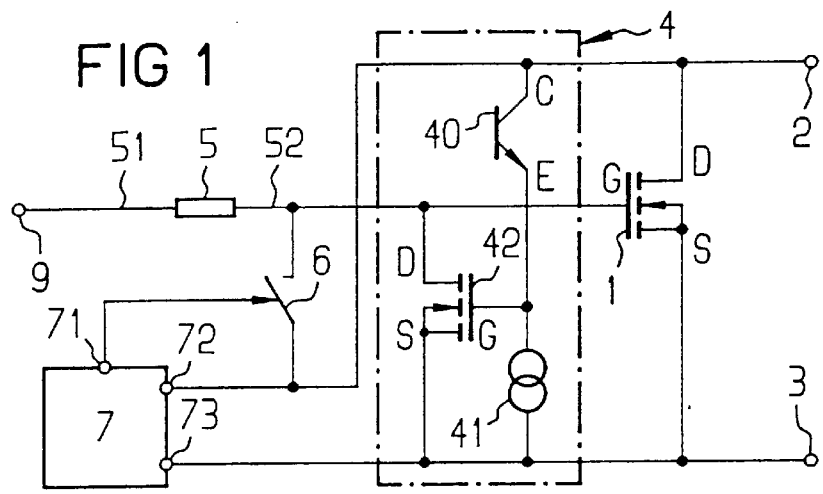
FIG. 1 is a schematic and block diagram of a circuit configuration according to the invention.

Referring now to the figures of the drawings in detail and first, particularly, to FIG. 1 thereof, there is seen a circuit configuration including a power MOSFET that is used as a power switch 1 and has a drain terminal D connected to a first terminal 2 and a source terminal S connected to a second terminal 3. A gate terminal G of the power switch 1 is connected through a resistor 5 to a terminal 9. The resistor 5 has two terminals 51, 52. A control signal for turning the power MOSFET 1 on and off can be applied to this terminal 9. A temperature sensor circuit 4 that is known per se is provided in order to turn off the power MOSFET 1 in the event of excess temperature. In the view of FIG. 1, this temperature sensor circuit 4 is only schematically shown, since it is already known per se. The temperature sensor circuit 4 has a series circuit of a temperature sensor 40 and a current source 41, which is connected between the terminals 2 and 3. The temperature sensor 40 is a bipolar transistor with an open base terminal in the illustrated exemplary embodiment. A collector terminal C of this bipolar transistor is connected to the terminal 2, while an emitter terminal E thereof is connected to the current source 41. A junction of the temperature sensor 40 and the current source 41 is connected to a gate terminal G of a depletion MOSFET 42. The depletion MOSFET 42 has a source terminal S connected to the terminal 3 and a drain terminal D connected to the gate terminal G of the power MOSFET 1.

The operation of the known circuit configuration described thus far can be described as follows. It is assumed in this case that an adequate positive potential to keep the power MOSFET 1 turned on is applied to the terminal 9. As long as the temperature sensor 40 detects a temperature below a predetermined threshold value of about 150° C. to 200° C. the MOSFET 42 remains blocked, because there is too slight a flow of current through the temperature sensor 40. The power MOSFET 1 remains on. If the chip temperature rises above the aforementioned threshold value, the MOSFET 42 becomes conducting. As a result, the gate terminal G of the power MOSFET 1 short-circuits to its source terminal S, thus interrupting the flow of load current from the terminal 2 to the terminal 3. If the circuit configuration cools down again, then the power MOSFET 1 is either turned on again, producing current oscillation from periodic heating and cooling, or the system remains off after the temperature shutoff, as long as the input voltage again drops to zero potential and is then returned to a positive value. However, the temperature sensor circuit 4 is functional only if the voltage between the terminals 2 and 3 is higher than a predetermined threshold, for instance of about 2 V. Below that, the known temperature sensor circuits 4 remain incapable of functioning.

The circuit configuration of FIG. 1 is therefore expanded by one switch device 6 and one control device 7. The switch device 6 is connected between the first terminal 2 and the control terminal G of the power MOSFET 1. An output-side terminal 71 of the control device 7 is connected to the switch device 6 for control of the switch device. The control device 7 is also connected between the first terminal 2 and the second terminal 3. Terminals 72 and 73 of the control device 7 are respectively connected with the first terminal 2 and the second terminal 3 for that purpose.

The control device 7 detects the voltage located between the terminals 2 and 3 and keeps the switch device 6 open as long as this voltage has a value at which the temperature sensor circuit 4 functions reliably. If this voltage drops below the aforementioned threshold, for instance of 2 V, the control device 7 turns the switch device 6 on, so that the positive gate potential of the power MOSFET 1 required for the turn-on is applied to the terminal 2. Since the necessary gate potential for turning on the power MOSFET is higher than the voltage necessary to make the temperature sensor circuit 4 capable of functioning, the temperature sensor circuit 4 responds immediately after the switch device 6 is turned on.

If an excess temperature is detected, the MOSFET 42 then immediately turns on and therefore the power MOSFET 1 turns off, even if originally the voltage applied between the terminals 2 and 3 might not have sufficed to trip the temperature sensor circuit 4.

Figure 2:
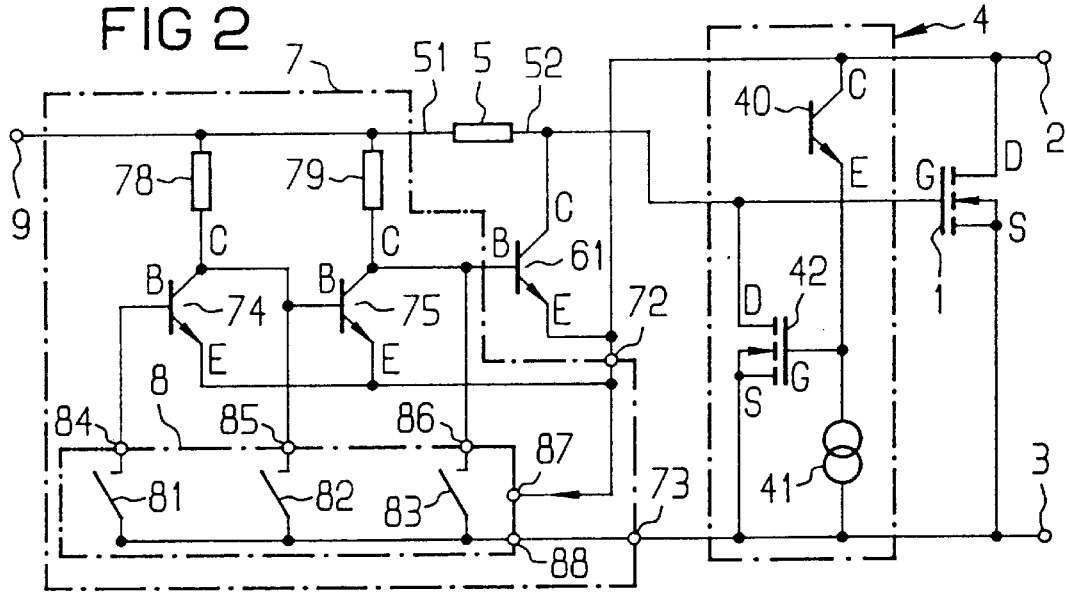
FIG. 2 is a more-detailed schematic diagram of a circuit configuration according to the invention with a switch device.

In FIG. 2, a more-detailed circuit diagram of the circuit configuration presented in FIG. 1 is shown. The reference numerals already explained will continue to be used for identical parts. The switch device 6 presented in FIG. 1 is realized in an exemplary embodiment of FIG. 2 by an npn bipolar transistor 61 having a collector terminal C which is connected to the gate terminal G and an emitter terminal E that is connected to the drain terminal D of the power MOSFET 1. An emitter terminal E of the bipolar transistor 61 is at the same time connected to the terminal 72 of the control device 7. Emitter terminals E of two further npn bipolar transistors 74, 75 are also connected to this terminal 72. Collector terminals C of these two bipolar transistors 74, 75 are each connected through a respective resistor 78, 79 to the terminal 9, and are thus connected to the terminal 51 of the resistor 5. The collector terminal C of the bipolar transistor 74 is connected to a base terminal B of the bipolar transistor 75 and the collector terminal C of the bipolar transistor 75 is applied to a base terminal B of the bipolar transistor 61. Base terminals B of the three bipolar transistors 61, 74 and 75 are each connected to a respective terminal 86, 84 and 85 of a further switch device 8, which has three switches 81, 82 and 83 that simultaneously connect the terminals 84, 85 and 86 to a terminal 88. The terminal 88 is connected to the terminal 73 and thus to the second terminal 3. The further switch device 8 has a terminal 87, which is connected to the terminal 72 and therefore to the first terminal 2 of the circuit configuration. The switches 81, 82 and 83 of the switch device 8 turn on whenever the voltage drop present between the terminals 87 and 88 of the further switch device 8, and therefore between the first terminal 2 and the second terminal 3, is below a certain value, such as 2 V.

Figure 3:
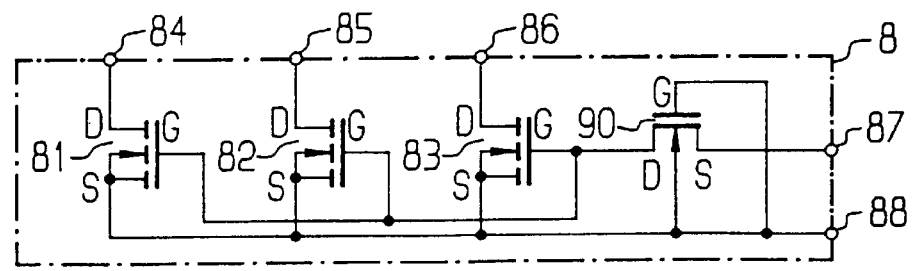
FIG. 3 is a schematic diagram of a concrete circuitry version of the switch device schematically shown in FIG. 2.

A concrete embodiment of the further switch device 8 is shown in FIG. 3. The switches 81, 82 and 83 are realized by n-channel enhancement MOSFETs, having drain terminals D which are each connected to a respective one of the terminals 84, 85 and 86 and source terminals which are jointly connected to the terminal 88. Gate terminals G of these MOSFETs 81, 82 and 83 are connected to a drain terminal D of an n-channel depletion MOSFET 90, having a source terminal which is connected to the terminal 87. The gate terminal G and a substrate terminal of this MOSFET 90 are likewise connected to the terminal 88.

The mode of operation of the circuit configuration shown in FIGS. 2 and 3 is as follows. It is assumed that a first terminal of a load, such as an incandescent light bulb, is connected to the power MOSFET 1 on the source side and thus to the second terminal 3 and is connected by a second terminal to reference potential. For instance, +15 V are applied to the first terminal 2. In order to turn on the power MOSFET 1, a sufficiently positive potential, for instance +20 V, is applied to the terminal 9. In that case, the temperature sensor circuit 4 functions perfectly, since the voltage drop present between the terminals 2 and 3 is sufficiently great to keep the temperature sensor circuit 4 functional. In that case, the switches 81, 82 and 83 of the further switch device 8 are turned off, since the source potential of the depletion MOSFET 90 is much higher than its gate potential, and therefore its drain potential does not suffice to close the switches 81, 82 and 83. Thus the depletion MOSFET 90 acts as a voltage-controlled electronic switch. The result is that the bipolar transistor 61 remains off.

Conversely, if the voltage drop present between the terminals 2 and 3 decreases sharply, for instance to below 2 V, then the depletion MOSFET 90 is conducting, and as a result the gate potential at the MOSFETs 81, 82, 83 of the further switch device 8 becomes sufficiently high to turn them on. As a result, the base terminals B of the bipolar transistors 61, 74 and 75 are brought to the potential of the second terminal 3, and as a result a sufficiently high base-to-emitter voltage reaches the bipolar transistor 61 and turns this bipolar transistor 61 on. As a result of the turning on of the bipolar transistor 61, the potential present at the terminal 52 of the resistor 5 is applied to the first terminal 2, as a result of which the temperature sensor circuit 4 receives a sufficiently high voltage to function. In the event of excess temperature, the MOSFET 42 is turned on, causing the power MOSFET 1 to open.

As FIG. 2 clearly shows, the emitter terminals E of the bipolar transistors 61, 74 and 75 are connected to the drain terminal D of the power MOSFET 1. This allows the entire circuit configuration to be integrated in a single semiconductor body. This integration will be described in further detail below in conjunction with FIGS. 4 and 5.

FIG. 4 shows a fragmentary sectional view of a semiconductor body. The semiconductor body has an n⁻-doped base body 20, with a lower main surface which is adjoined by an n⁺-doped layer 21. In a first region B1, a vertical power MOSFET that is known per se is integrated with the base body 20. To that end, many p-doped regions 22 containing n⁺-doped wells 23 are embedded in an upper main surface of the base body 20. The n⁺-doped wells 23 are in contact with a source electrode S, while on the main surface of the base body 20 between the p-doped regions, there is an oxide layer 24, and over it a metal layer 25, which is in contact with a gate electrode G. The n⁺-doped layer 21 is connected in the first region B1 to a drain electrode D. In this kind of MOSFET which is constructed vertically in the semiconductor body, controlled channels (shown dotted in FIG. 4) are located as lateral structures on the upper surface or top side of the chip, while the drain electrode D, as seen in FIG. 4, is located on the lower surface or underside of the chip. Located between them is the high-impedance n-doped layer of the base body 20, for receiving a space charge zone.

A vertical bipolar transistor is realized in a second region B2 of the semiconductor body. To that end, a p-doped region 26 in which an n⁺-doped well 27 is located is embedded in the base body 20 on the upper main surface. The p-doped region 26 is contacted by a base electrode B, and the n+-doped well 27 is contacted by a collector electrode C. The n+-doped layer 21 is provided with an emitter electrode E in the region B2 of the vertical bipolar transistor. If needed, a plurality of bipolar transistors, for instance three, as explained in conjunction with the circuit configuration of FIG. 2, may be integrated into the base body 20 of the semiconductor body.

In order to enable integrating the circuit configuration present in FIG. 2 entirely in a single semiconductor body, it is readily possible to integrate additional regions, for instance with laterally disposed MOSFETs, into the base body 20.

In FIG. 5, one such lateral MOSFET, which is known per se, is shown in a third region B3. In the third region B3, a p-doped region 28 in which n+-doped wells 29, 30 are located is embedded in the base body 20 on the upper main surface. The n+-doped wells 29, 30 are respectively in contact with a source electrode S and a drain electrode D, while on the main surface of the base body 20 between the p-doped regions, there is an oxide layer 31, and over it a metal layer 32, which is in contact with a gate electrode G.

The n+-doped layer 21 is suitably provided on its outer surface with a metallizing 11 that embodies the electrodes which are to be connected to one another, that is the drain electrode D of the power MOSFET and the emitter electrodes E, of the bipolar transistors. The MOSFETs 81, 82 and 83 presented in FIG. 3 can easily be integrated into the semiconductor body of FIG. 5 in the form of lateral enhancement MOSFETs. Conversely, the depletion MOSFET 90 shown in FIG. 3 is suitably constructed vertically. Since the resistors 5, 78 and 79 present in FIG. 2 can also be constructed as depletion MOSFETs, it is possible to integrate the entire circuit configuration of FIG. 2 in a single semiconductor body. The circuit configuration of FIG. 2 integrated into a single semiconductor body enables reliable shutoff of the power MOSFET, even if the voltage dropping at the load path of the power MOSFET is not sufficient to trip a temperature sensor circuit, that is known per se, which can likewise be integrated into the semiconductor body.

I claim:

1. A circuit configuration, comprising:

first and second terminals;

a power switch having a control terminal;

an electronic switch connected between the control terminal and said second terminal for turning off said power switch at excess temperature;

a temperature sensor circuit connected between said first and second terminals and connected to said electronic switch;

a switch device connected between said first terminal and the control terminal; and a control device connected between said first and second terminals, said control device having an output side connected to said switch device, said control device detecting a voltage between said first and second terminals, said control device comparing said voltage to a predetermined value and closing said switch device if said voltage is below the predetermined value, said switch device in a closed position applying a potential of said control terminal of said power switch to said temperature sensor circuit, and said switch device remaining open if said voltage exceeds the predetermined value.

2. The circuit configuration according to claim 1, wherein said switch device has a bipolar transistor, and said bipolar transistor has a load path connected between the control terminal and said first terminal and a base terminal connected to said control device.

3. The circuit configuration according to claim 1, including:

a further resistor having two terminals; and a further switch device having switches connected to said second terminal;

said switch device having a control terminal; and said control device having first and second bipolar transistors with emitter, collector and base terminals, the emitter terminals of said first and second bipolar transistors being connected to said first terminal, resistors each being connected between the collector terminal of a respective one of said first and second bipolar transistors and one of the terminals of said further resistor, the other of the terminals of said further resistor being connected to the control terminal of said power switch, the collector terminal of said first bipolar transistor being connected to the base terminal of said second bipolar transistor, the collector terminal of said second bipolar transistor being connected to the control terminal of said switch device, and the base terminals of said first and second bipolar transistors and the control terminal of said switch device each being connected through a respective one of said switches of said further switch device to said second terminal.

4. The circuit configuration according to claim 3, wherein said further switch of said device are MOSFETs having gate terminals, and said further switch device includes a switch to be controlled as a function of voltage, said switch being connected between the gate terminals of said MOSFETs and said first terminal.

5. The circuit configuration according to claim 4, wherein said switch is a depletion MOSFET having a source terminal connected to said first terminal, a gate terminal connected to said second terminal, and a drain terminal connected to the gate terminals of said MOSFETs of said further switch device.

6. The circuit configuration according to claim 1, wherein said power switch is a power MOSFET having a drain terminal connected to said first terminal and a source terminal connected to said second terminal.

* * * * *